(12) United States Patent
Teng et al.

(10) Patent No.: US 9,129,951 B2
(45) Date of Patent: Sep. 8, 2015

(54) COATED LEAD FRAME BOND FINGER

(71) Applicants: Seng Kiong Teng, Shah Alam (MY); Ly Hoon Khoo, Bandar Puteri Klang (MY); Wen Shi Koh, Petaling Jaya (MY)

(72) Inventors: Seng Kiong Teng, Shah Alam (MY); Ly Hoon Khoo, Bandar Puteri Klang (MY); Wen Shi Koh, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 60 days.

(21) Appl. No.: 14/056,930

(22) Filed: Oct. 17, 2013

(65) Prior Publication Data
US 2015/0108623 A1    Apr. 23, 2015

(51) Int. Cl.
*H01L 29/40* (2006.01)
*H01L 23/495* (2006.01)

(52) U.S. Cl.
CPC . *H01L 23/49586* (2013.01); *H01L 2224/48091* (2013.01); *H01L 2224/48247* (2013.01)

(58) Field of Classification Search
CPC .................. H01L 2224/73265; H01L 24/28; H01L 23/49586; H01L 2224/85375
USPC .................................................. 257/784, 666
See application file for complete search history.

(56) References Cited

U.S. PATENT DOCUMENTS

| | | | |
|---|---|---|---|
| 4,933,305 A * | 6/1990 | Kikkawa | 438/120 |
| 5,122,858 A | 6/1992 | Mahulikar | |
| 5,436,082 A | 7/1995 | Matthew | |
| 5,510,197 A | 4/1996 | Takahashi et al. | |
| 5,728,285 A | 3/1998 | Matthew | |
| 5,882,955 A | 3/1999 | Huang et al. | |
| 5,914,532 A | 6/1999 | Akagi et al. | |
| 6,040,984 A * | 3/2000 | Hirakawa | 361/777 |
| 6,130,027 A | 10/2000 | Hamada | |
| 6,177,726 B1 * | 1/2001 | Manteghi | 257/725 |
| 6,181,009 B1 | 1/2001 | Takahashi et al. | |
| 6,203,931 B1 | 3/2001 | Chu | |
| 6,246,106 B1 | 6/2001 | Sugimoto et al. | |
| 6,268,647 B1 | 7/2001 | Takahashi et al. | |
| 6,299,932 B1 | 10/2001 | Mihara | |
| 6,309,698 B1 | 10/2001 | Uesugi et al. | |
| 6,395,583 B1 | 5/2002 | Kubara et al. | |
| 6,399,220 B1 | 6/2002 | Abys | |
| 6,491,043 B2 | 12/2002 | Mohindra | |
| 6,521,358 B1 | 2/2003 | Tanaka | |
| 6,733,823 B2 | 5/2004 | Lee | |
| 6,864,564 B2 * | 3/2005 | Ke et al. | 257/666 |
| 6,940,184 B2 * | 9/2005 | Ueda et al. | 257/790 |
| 7,087,315 B2 | 8/2006 | Matsuo | |
| 7,887,928 B2 | 2/2011 | Wang | |

(Continued)

OTHER PUBLICATIONS

Lee, C.; Hoesler, W.; Cerva, H.; Von Criegern, R.; Parthasarathi, A. A Novel High Performance Adhesion Enhancing Zn-Cr Leadframe Coating for Popcorn Prevention. IEEE Transactions on Advance Packaging, vol. 22, Issue 3, Aug. 1999, pp. 398-406.

*Primary Examiner* — S. V. Clark
(74) *Attorney, Agent, or Firm* — Charles Bergere

(57) ABSTRACT

A lead frame includes a lead formed of a conductive material and having first and second ends, opposing first and second main surfaces, and opposing first and second side surfaces each extending between the first and second main surfaces. A polymeric layer is formed at least on the first main surface and the first and second side surfaces of the lead at least proximate the second end of the lead. An opening in the polymeric layer on the first main surface of the lead proximate the second end is provided for connecting the lead to, for example, a semiconductor die via a bond wire.

6 Claims, 3 Drawing Sheets

(56) References Cited

U.S. PATENT DOCUMENTS

| | | |
|---|---|---|
| 8,384,205 B2 * | 2/2013 | Low et al. .................... 257/692 |
| 2001/0022390 A1 * | 9/2001 | Waitl et al. ................... 257/666 |
| 2002/0027294 A1 | 3/2002 | Neuhaus |
| 2003/0006488 A1 * | 1/2003 | Wakabayashi et al. ....... 257/666 |
| 2009/0108423 A1 * | 4/2009 | Riedl et al. .................... 257/675 |
| 2014/0076613 A1 * | 3/2014 | Mahler et al. ................. 174/251 |

* cited by examiner

COATED LEAD FRAME BOND FINGER

BACKGROUND OF THE INVENTION

The present invention is directed to a semiconductor device and method of making semiconductor devices with coated lead frame bond fingers.

Recent advances have led to the use of higher input/output lead counts on lead frames for semiconductor chip packages. However, a limitation exists in that the lead pitch must be sufficient to prevent shorting of the lead frame. This reduces the number of leads that can be utilized on a package. High clamping forces during molding processes, the presence of foreign material, and human handling all contribute to lead displacement, wherein the lead frame is shorted by electrical and physical contact between two or more leads.

It is therefore desirable to provide a lead frame that limits or prevents electrical shorts of the lead frame caused by the package manufacturing process and/or human handling of the lead frame.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

Figure 1:
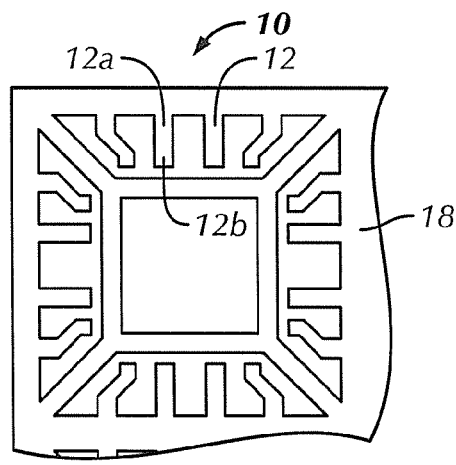
FIG. 1 is a top plan view of a lead frame in accordance with a first embodiment of the invention.

Referring to the drawings, wherein the same reference numerals are used to designate the same components throughout the several figures, there is shown in FIG. 1 a lead frame 10 in accordance with an embodiment of the invention. The lead frame 10 preferably includes a plurality of leads 12 each being made from a conductive material, such as copper (Cu), aluminum (Al), or the like. As will be explained below, the leads 12 may also be coated, alloyed, or pre-plated with a metal layer or layers such as silver (Ag), gold (Au), nickel (Ni), palladium (Pd), tin (Sn), or the like. However, other materials may be used for the leads 12. The number and shapes of the conductive leads 12 may be varied as necessary depending on the end use configurations and other such factors.

Figure 3:
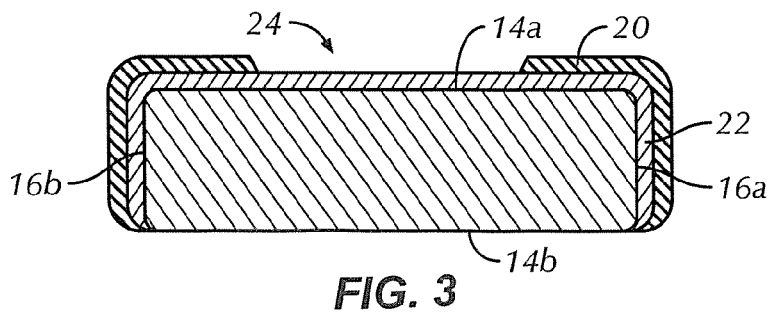
FIG. 3 is a cross-sectional side elevational view of the lead of FIG. 2.

Each lead 12 preferably has a first end 12a and a second end 12b. As can be seen in FIG. 3, each lead 12 also preferably has first and second opposing main surfaces 14a, 14b and first and second opposing side surfaces 16a, 16b that extend between the first and second main surfaces 14a, 14b. Although the first and second main surfaces 14a, 14b and first and second side surfaces 16a, 16b are each shown to be generally flat, each may be shaped, contoured, tapered, angled, or the like according to the needs of the application. In addition, the first and second main surfaces 14a, 14b are not required to be identical in shape, size, or the like to one another, nor are the first and second side surfaces 16a, 16b required to be alike. Moreover, variations in shape, thickness, or the like among leads 12 on the lead frame 10 are also contemplated.

In FIG. 1, the first end 12a of each lead 12 is shown as being coupled to a support 18, which is typically separated from the leads 12 upon completion of a package. However, the second end 12b of each lead 12 may also or alternatively be connected to a support (not shown), as necessary.

Figure 2:
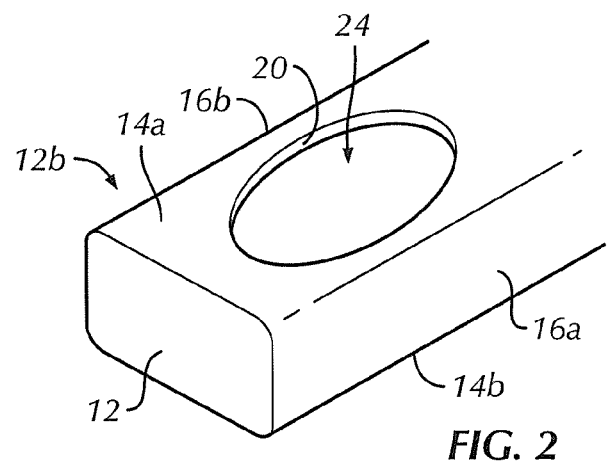
FIG. 2 is a greatly enlarged partial side perspective view of a lead of the lead frame of FIG. 1.

Referring to FIGS. 2 and 3, an insulative layer 20 is preferably formed on at least the first main surface 14a and the first and second side surfaces 16a, 16b of each lead 12, at least proximate to the second end 12b of the lead 12. The insulative layer 20 can also extend over part or all of the second main surface 14b of the lead 12, or other portions of the lead 12 proximate either of the first or second ends 12a, 12b. However, the first main surface 14a and the first and second side surfaces 16a, 16b near the second end 12b are the most likely points of inadvertent contact among adjacent leads 12, and so the insulative layer 20 should at least be formed at such locations.

The insulative layer 20 is preferably made from a polymeric material, in particular a polymeric material with a melting temperature above about 250° C. Such polymeric materials include, for example, polytetrafluoroethylene (PTFE) or the like. The insulative layer 20 preferably also has a thickness greater than about 1 micron. Although the thickness of the insulative layer 20 in FIG. 3 is shown as being generally uniform, variations in thickness may be utilized.

The insulative layer 20 may be applied through various techniques, including coating, dipping, spraying, or the like. The second ends 12b of the leads 12 may be taped or otherwise secured in position prior to the process of applying the insulative layer 20, if necessary.

In preferred embodiments, each lead 12 may have a coating 22 of a conductive material, preferably silver or the like, disposed between the conductive material of the lead 12 and the insulative layer 20 on at least the first main surface 14a and the first and second side surfaces 16a, 16b of the lead 12 at least proximate the second end 12b of the lead 12.

An opening 24 is preferably formed in the insulative layer 20 on the first main surface 14a of each lead 12 proximate the second end 12b of the lead 12. The opening 24 allows for the electrical coupling of a bond wire 44 (see FIG. 10) to the lead 12 by exposing the conductive material of the lead 12, or in the case of FIGS. 2 and 3, the conductive coating 22, for connection of the lead 12 with the bond wire 44.

The openings 24 on the leads 12 may be formed using various techniques. One such technique is shown in FIGS.

Figure 4:
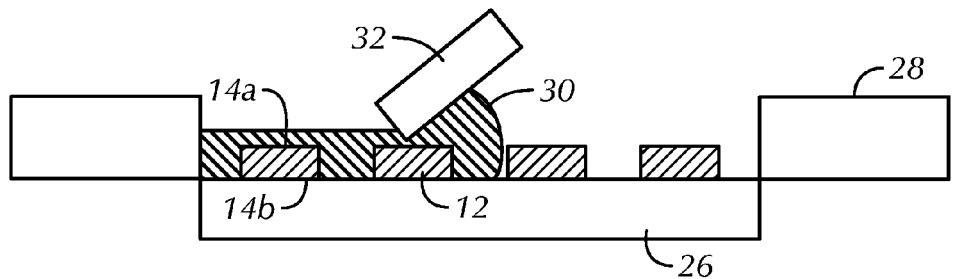
FIG. 4 is a cross-sectional side elevational view of lead frame having an insulative layer formed thereon in accordance with a second embodiment of the invention.

4-7. For example, in FIG. 4, the leads 12 may be placed with their respective second main surfaces 14b disposed on a supporting body 26, such as tape or the like, positioned in a frame 28. A coating paste 30 of the insulative material may be applied over the leads 12 using a squeegee 32 or the like.

Figure 5:
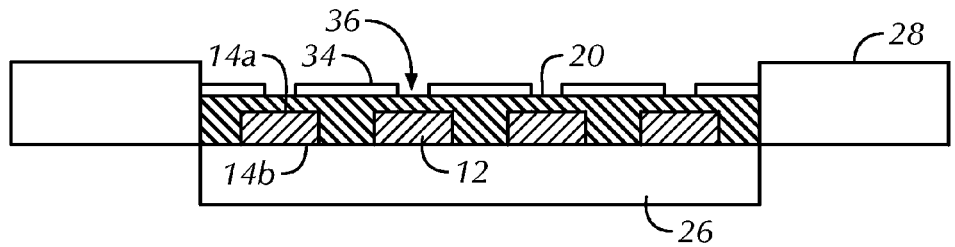
FIG. 5 is a cross-sectional side elevational view of a the lead frame of FIG. 4 with a mask disposed on the insulative layer.
Figure 6:
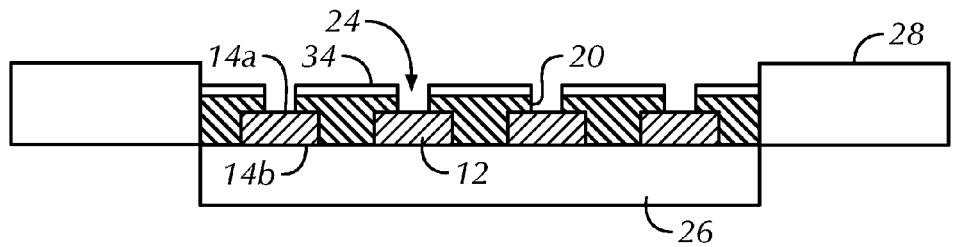
FIG. 6 is a cross-sectional side elevational view of the lead frame of FIG. 5 following removal of unmasked portions of the insulative layer.
Figure 7:
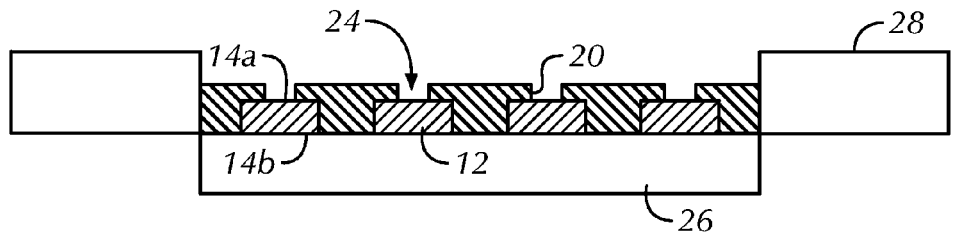
FIG. 7 is a cross-sectional side elevational view of the lead frame of FIG. 6 following removal of the mask.

In FIG. 5, a mask 34 is placed on the formed insulative layer 20. The mask 34 includes spaced apart apertures 36 corresponding to desired locations of the openings 24 on the leads 12. In FIG. 6, in locations where the insulative layer 22 is exposed through the apertures 36 of the mask 34 (i.e., unmasked areas), the material of the insulative layer 20 is removed via mechanical etching, chemical etching, or the like to form the openings 24. In FIG. 7, the mask 34 is removed.

Figure 8:
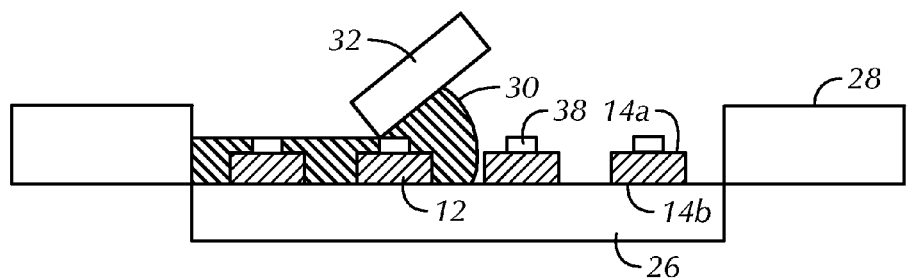
FIG. 8 is a cross-sectional side elevational view of a lead frame with a mask arranged thereon and having an insulative layer formed thereon in accordance with a third embodiment of the invention.
Figure 9:
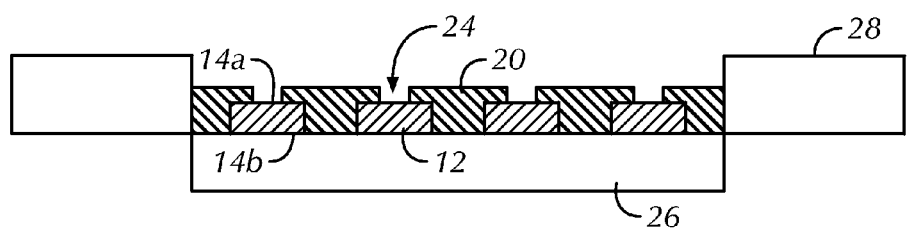
FIG. 9 is a cross-sectional side elevational view of the lead frame of FIG. 8 following removal of the mask.

FIGS. 8-9 show an alternative method for forming the openings 24. In FIG. 8, prior to formation of the insulative layer 20, a mask 38, such as a stencil sheet or the like, is placed on the leads 12 such that the desired locations for the openings 24 are covered. As before, a coating paste 30 of the insulative material may be applied to the leads 12 using a squeegee 32 or the like. In FIG. 9, following the formation of the insulative layer 20, the mask 38 is removed, leaving the openings 24.

Figure 10:
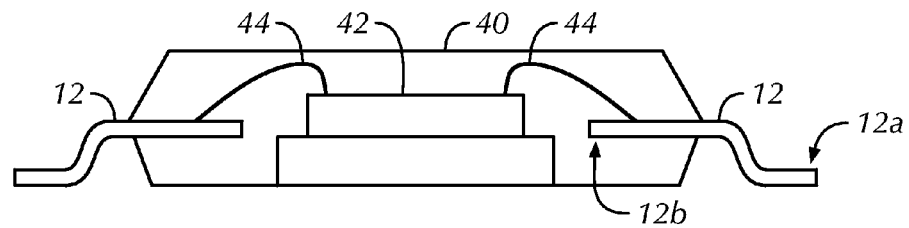
FIG. 10 is a cut-away side elevational view of a semiconductor package in accordance with a fourth embodiment of the invention.

FIG. 10 shows an embodiment of a package 40 formed using the leads 12 according to the present invention. The package 40 may be constructed from a mold compound, such as a ceramic material, a polymeric material, or the like. A semiconductor die 42 is embedded in the package 40. The semiconductor die 42 is typically in the form of an integrated circuit (IC) or the like. The semiconductor die 42 may be made from any semiconductor material or combinations of materials, such as gallium arsenide, silicon germanium, silicon-on-insulator (SOI), silicon, monocrystalline silicon, the like, and combinations of the above.

The first end 12a of each lead 12 extends outside of the package 40 while the second end 12b of each lead 12 is embedded in the package 40. The first ends 12a of the leads 12 allow the package 40 to be connected to an external circuit board or the like (not shown). Bond wires 44 are also embedded in the package 40 and electrically connect the semiconductor die 42 to the second ends 12b in the areas of the openings 24 in the insulative layer 20 of the leads 12. The bond wires 44 are preferably formed from gold, although other materials may be used.

Each bond wire 44 extends through a respective opening 24 in the insulative layer 20 on a corresponding lead 12 to allow the electrical connection. The bond wire 44 may be attached using conventional wire bonding techniques.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor device, comprising:
   a package;
   a semiconductor die embedded in the package;
   a plurality of leads including at least one lead that has a first end extending outside of the package and a second end embedded in the package, the lead being formed of a conductive material and having opposing first and second main surfaces and opposing first and second side surfaces each extending between the first and second main surfaces;
   a bond wire embedded in the package and having a first end electrically connected to the semiconductor die and a second end electrically connected proximate to the second end of the lead; and
   an insulative layer formed on the first main surface and the first and second side surfaces of the lead at least proximate the second end of the lead, wherein the insulative layer fills a gap between the lead and an adjacent lead at least at an area proximate the second end of the lead, the bond wire extending through an opening in the insulative layer on the first main surface of the lead to electrically connect with the lead.

2. The semiconductor device of claim 1, wherein the insulative layer is made from a polymeric material having a melting temperature above about 250° C.

3. The semiconductor device of claim 2, wherein the polymeric material is polytetrafluoroethylene.

4. The semiconductor device of claim 1, wherein the insulative layer has a thickness of greater than about 1 micron.

5. The semiconductor device of claim 1, further comprising a coating of silver disposed between the conductive material and the insulative layer on at least the first main surface of the lead at least proximate the second end of the lead.

6. The semiconductor device of claim 1, wherein the conductive material of the lead is copper.

* * * * *